(12) United States Patent
Kawai

(10) Patent No.: US 12,058,818 B2
(45) Date of Patent: Aug. 6, 2024

(54) METHOD FOR MANUFACTURING PRINTED WIRING BOARD

(71) Applicant: IBIDEN CO., LTD., Gifu (JP)

(72) Inventor: Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 6 days.

(21) Appl. No.: 17/815,575

(22) Filed: Jul. 28, 2022

(65) Prior Publication Data

US 2023/0030601 A1 Feb. 2, 2023

(30) Foreign Application Priority Data

Jul. 30, 2021 (JP) .................................. 2021-125915

(51) Int. Cl.
| | |
|---|---|
| *C25D 5/34* | (2006.01) |
| *C25D 3/38* | (2006.01) |
| *C25D 5/02* | (2006.01) |
| *C25D 5/48* | (2006.01) |
| *H05K 3/06* | (2006.01) |
| *H05K 3/10* | (2006.01) |

(Continued)

(52) U.S. Cl.
CPC ............... *H05K 3/423* (2013.01); *C25D 3/38* (2013.01); *C25D 5/022* (2013.01); *C25D 5/34* (2013.01); *C25D 5/48* (2013.01); *H05K 3/061* (2013.01); *H05K 3/108* (2013.01); *H05K 3/26* (2013.01); *H05K 3/427* (2013.01); *H05K 2203/143* (2013.01); *H05K 2203/1461* (2013.01)

(58) Field of Classification Search
None
See application file for complete search history.

(56) References Cited

U.S. PATENT DOCUMENTS 6,497,991 B1 * 12/2002 Ishiguro ............... H05K 3/0094
430/311
9,805,996 B2 * 10/2017 Hsu ...................... H01L 21/4846
(Continued)

FOREIGN PATENT DOCUMENTS

JP 2005-072454 A 3/2005

OTHER PUBLICATIONS

English translation JP 2018078273, Huang et al. (Year: 2018).*
English translation JP 10323962 (Year: 1998).*

*Primary Examiner* — Stefanie S Wittenberg
(74) *Attorney, Agent, or Firm* — Oblon, McClelland, Maier & Neustadt, L.L.P.

(57) ABSTRACT

A method for manufacturing a printed wiring board includes forming through holes in a double-sided copper-clad laminated plate such that a high-density region of the through holes and a low-density region of the through holes are formed, forming an electrolytic plating film on a copper foil of the plate in the high-density and low-density regions, forming a masking resist to mask the plating film in the high-density region, etching the plating film in the low-density region exposed from the resist such that the plating film in the low-density region is thinned, peeling off the resist from the plating film in the high-density region, and forming a conductor circuit including the copper foil and the plating film in the high-density and low-density regions. The forming of the plating film on the copper foil of the plate includes forming the plating film in the through holes in the high-density and low-density regions.

20 Claims, 10 Drawing Sheets

(51) Int. Cl.
*H05K 3/26* (2006.01)
*H05K 3/42* (2006.01)

(56) References Cited

U.S. PATENT DOCUMENTS

| | | | |
|---|---|---|---|
| 2006/0081477 A1* | 4/2006 | Basol | C25D 5/22 |
| | | | 257/E21.585 |
| 2012/0024586 A1* | 2/2012 | Yoshimura | H05K 1/036 |
| | | | 29/852 |
| 2013/0126221 A1* | 5/2013 | Kanda | H05K 1/0298 |
| | | | 156/182 |

* cited by examiner

PRIOR ART
FIG. 3(a)
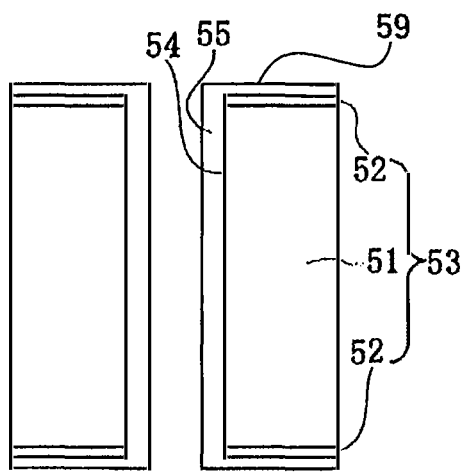
PRIOR ART
FIG. 3(b)
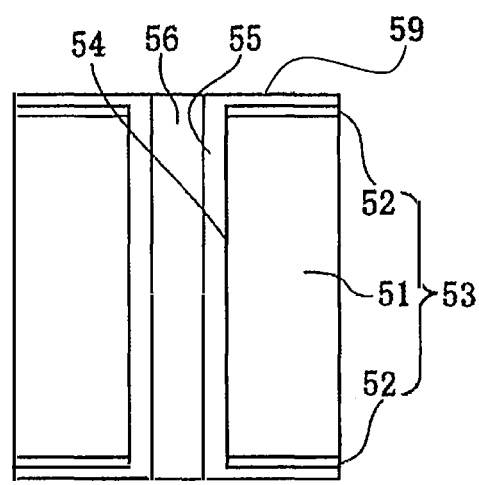
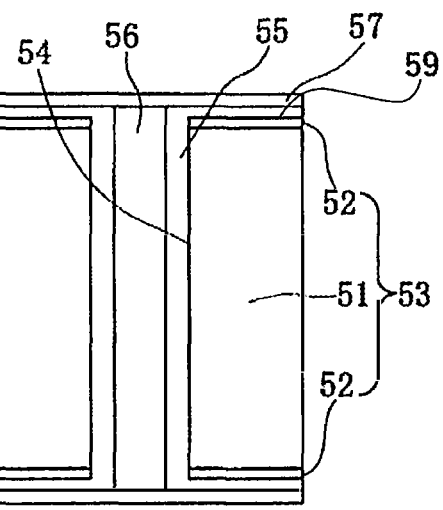
FIG. 3(c)
PRIOR ART
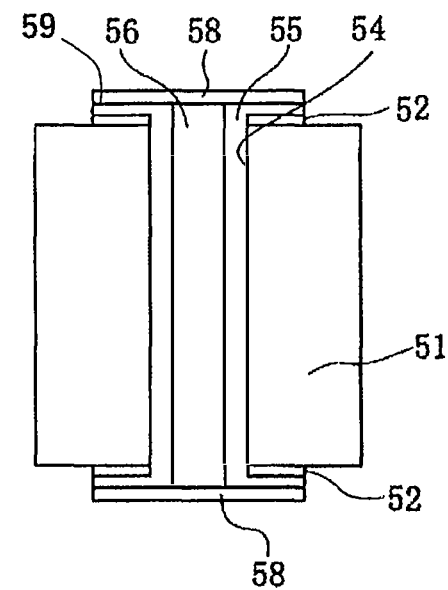
FIG. 3(d)
PRIOR ART

METHOD FOR MANUFACTURING PRINTED WIRING BOARD

CROSS-REFERENCE TO RELATED APPLICATIONS

The present application is based upon and claims the benefit of priority to Japanese Patent Application No. 2021-125915, filed Jul. 30, 2021, the entire contents of which are incorporated herein by reference.

BACKGROUND OF THE INVENTION

Field of the Invention

The present invention relates to a method for manufacturing a printed wiring board having through holes.

Description of Background Art

Japanese Patent Application Laid-Open Publication No. 2005-72454 describes a printed wiring board having multiple through holes with a high density. The entire contents of this publication are incorporated herein by reference.

SUMMARY OF THE INVENTION

According to one aspect of the present invention, a method for manufacturing a printed wiring board includes forming through holes in a double-sided copper-clad laminated plate such that a high-density region of the through holes and a low-density region of the through holes are formed, forming an electrolytic plating film on a copper foil of the double-sided copper-clad laminated plate in the high-density and low-density regions of the through holes, forming a masking resist on the electrolytic plating film in the high-density region of the through holes such that the masking resist masks the electrolytic plating film in the high-density region of the through holes, etching the electrolytic plating film in the low-density region of the through holes exposed from the masking resist such that the electrolytic plating film in the low-density region of the through holes exposed from the masking resist is thinned, peeling off the masking resist from the electrolytic plating film in the high-density region of the through holes, and forming a conductor circuit including the copper foil and the electrolytic plating film in the high-density and low-density regions of the through holes. The forming of the electrolytic plating film on the copper foil of the double-sided copper-clad laminated plate includes forming the electrolytic plating film in the through holes in the high-density and low-density regions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3($a$)-3($d$) are diagrams describing processes in a conventional method for manufacturing a printed wiring board.

DETAILED DESCRIPTION OF THE EMBODIMENTS

Figure 1A:
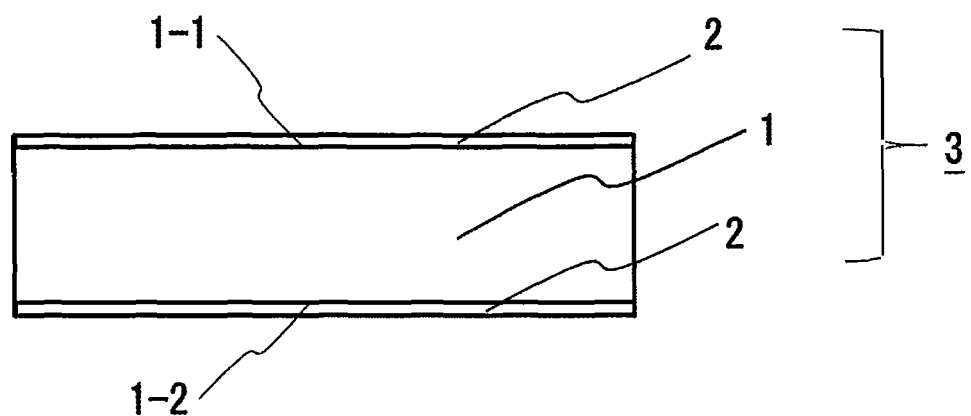
FIG. 1A is a diagram describing a process in a method for manufacturing a printed wiring board according to an embodiment of the present invention.

Embodiments will now be described with reference to the accompanying drawings, wherein like reference numerals designate corresponding or identical elements throughout the various drawings.

Each of FIGS. 1A-1M is a diagram for describing a process in a method for manufacturing a printed wiring board according to an embodiment of the present invention. In the example illustrated in FIGS. 1A-1M, dimensions of members are described with dimensions different from actual dimensions so as to facilitate better understanding of the characteristics of the present invention. In the following, with reference to FIGS. 1A-1M, a method for manufacturing a printed wiring board according to an embodiment of the present invention is described. Each of FIGS. 1K and 1L illustrates a process of the embodiment in which a conductor circuit is formed using a subtractive method.

Figure 1B:
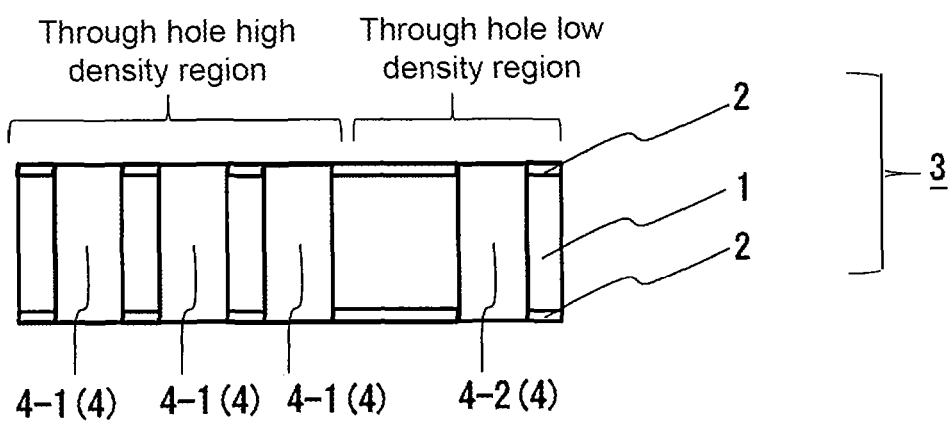
FIG. 1B is a diagram describing a process in a method for manufacturing a printed wiring board according to an embodiment of the present invention.
Figure 1C:
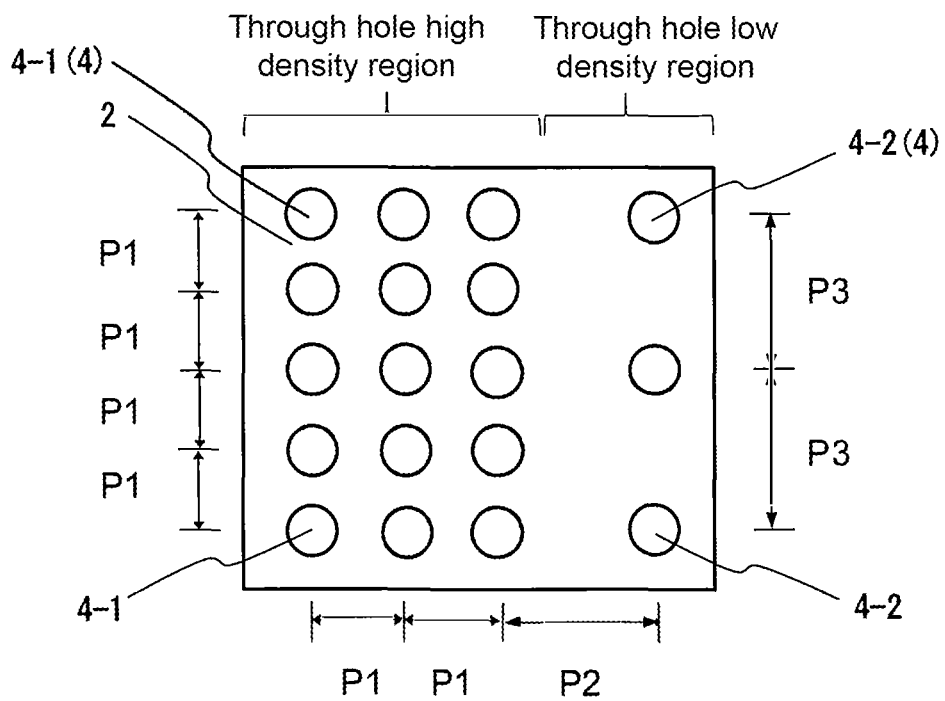
FIG. 1C is a diagram describing a process in a method for manufacturing a printed wiring board according to an embodiment of the present invention.

First, as illustrated in FIG. 1A, a double-sided copper-clad laminated plate 3 is prepared, which is formed of an insulating substrate 1 and a copper foil 2, the insulating substrate 1 having a first surface (1-1) and a second surface (1-2) on the opposite side with respect to the first surface (1-1), and the copper foil 2 being laminated on the first surface (1-1) and on the second surface (1-2) of the insulating substrate 1. Next, as illustrated in FIG. 1B, multiple through holes 4 are formed in the double-sided copper-clad laminated plate 3. As illustrated in FIGS. 1B and 1C, the multiple through holes 4 are divided into through holes (4-1) formed in a high-density region of the through holes and through holes (4-2) formed in a low-density region of the through holes. For example, the through holes (4-1) formed in the high-density region may be formed at equal intervals (pitch (P1)), the through holes (4-1) and the through holes (4-2) (formed in the low-density region) may be formed at equal intervals (pitch (P2)), and the through holes (4-2) may be formed at equal intervals (pitch (P3)). The intervals (pitch (P1)) between the through holes (4-1) formed in the high-density region may be appropriately set in relation to a size of the double-sided copper-clad laminated plate 3, but are preferably 300 μm or more. The intervals (pitch (P2)) between the through holes (4-1) formed in the high-density region and the through holes (4-2) formed in the low-density region may be appropriately set in relation to the size of the double-sided copper-clad laminated plate 3, but are preferably 600 μm or more. The intervals (pitch (P3)) between the through holes (4-2) formed in the low-density region may be appropriately set in relation to the size of the double-sided copper-clad laminated plate 3, but are preferably 600 μm or more.

Figure 1D:
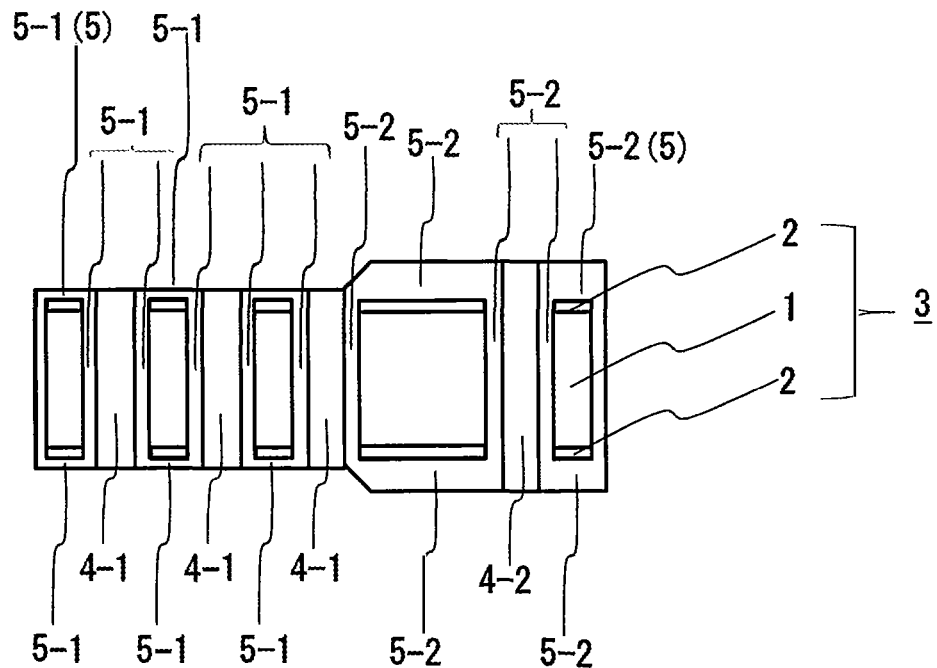
FIG. 1D is a diagram describing a process in a method for manufacturing a printed wiring board according to an embodiment of the present invention.

Further, as illustrated in FIG. 1D, an electrolytic plating film 5 is formed on the copper foil 2 of the double-sided copper-clad laminated plate 3 in the high-density region, in the through holes (4-1) in the high-density region, on the copper foil 2 of the double-sided copper-clad laminated plate 3 in the low-density region, and in the through holes (4-2) in the low-density region. Here, the electrolytic plating film (5-1) formed on the copper foil 2 in the high-density region and the electrolytic plating film (5-2) formed on the copper foil 2 in the low-density region have different film thicknesses. The electrolytic plating film (5-2) formed on the copper foil 2 in the low-density region is thicker than the electrolytic plating film (5-1) formed on the copper foil 2 in the high-density region. Therefore, a difference in plating film thickness occurs between the electrolytic plating film (5-1) formed on the copper foil 2 in the high-density region and the electrolytic plating film (5-2) formed on the copper foil 2 in the low-density region. The electrolytic plating film (5-1) formed in the through holes (4-1) in the high-density region and the electrolytic plating film (5-2) formed in the through holes (4-2) in the low-density region have different film thicknesses. The electrolytic plating film (5-2) formed in the through holes (4-1) in the low-density region is thicker than the electrolytic plating film (5-1) formed in the through holes (4-2) in the high-density region. Therefore, a difference in plating film thickness occurs between the electrolytic plating film (5-1) formed in the through holes (4-1) in the high-density region and the electrolytic plating film (5-2) formed in the through holes (4-2) in the low-density region.

Here, as the double-sided copper-clad laminated plate 3, a commercially available double-sided copper-clad laminated plate (CCL) may be used. The through holes (4-1) and the through holes (4-2) may be formed in the double-sided copper-clad laminated plate 3 using a method, for example, by drilling, or laser (such as CO2, UV-YAG, or excimer) processing. Further, after the formation of the through holes (4-1) and the through holes (4-2) and before the formation of the electrolytic plating film 5, it is preferable to remove residues on the copper foil 2, in the through holes (4-1), and in the through holes (4-2) generated during the formation of the through holes. The residues may be removed, for example, by a desmear treatment using permanganate+ sodium hydroxide, a desmear treatment using plasma using CF4, or the like. Here, the electrolytic plating film 5 is formed by electroless copper plating followed by electrolytic copper plating.

Figure 1E:
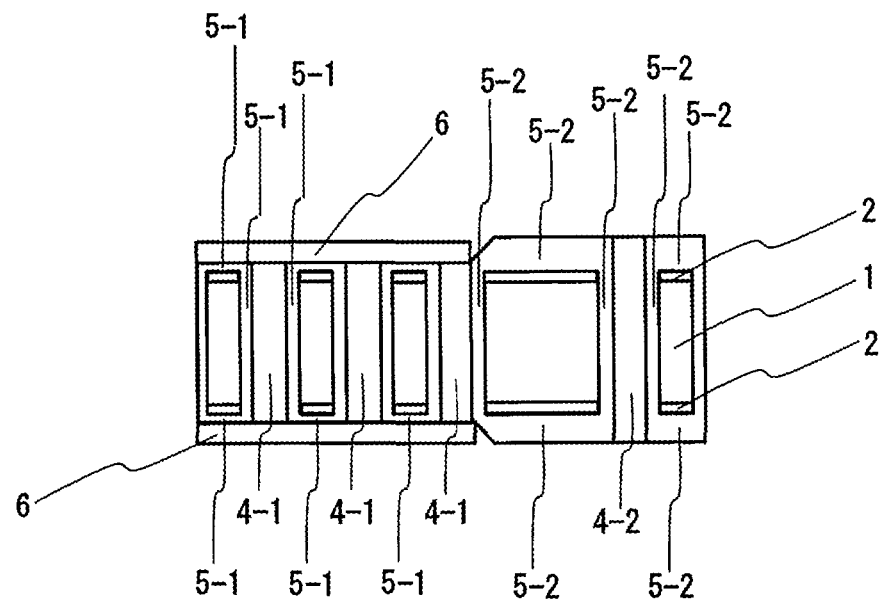
FIG. 1E is a diagram describing a process in a method for manufacturing a printed wiring board according to an embodiment of the present invention.

Next, as illustrated in FIG. 1E, the electrolytic plating film (5-1) in the high-density region on the first surface is masked with a masking resist 6. The masking resist 6 masks the electrolytic plating film (5-1) formed on the copper foil 2 in the high-density region, the electrolytic plating film (5-1) formed in the through holes (4-1) in the high-density region, and the through holes (4-1). By masking the high-density region of the first surface with the masking resist 6, the film thickness of the electrolytic plating film (5-1) formed on the copper foil 2 in the high-density region and the film thickness of the electrolytic plating film (5-1) formed in the through holes (4-1) in the high-density region may be maintained as they are. Further, similar to that on the first surface, the high-density region on the second surface is masked with a masking resist 6.

Figure 1F:
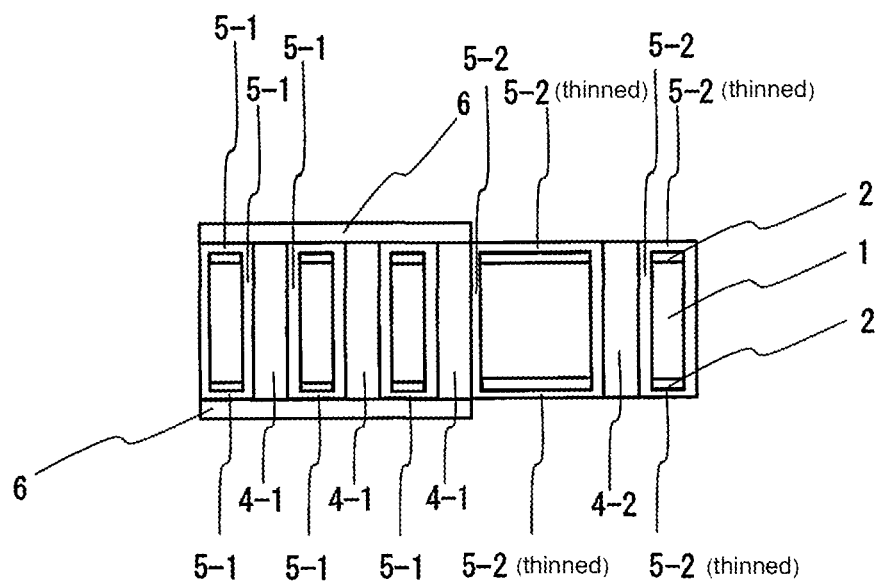
FIG. 1F is a diagram describing a process in a method for manufacturing a printed wiring board according to an embodiment of the present invention.

Next, as illustrated in FIG. 1F, the electrolytic plating film (5-2) formed in the low-density region exposed from the masking resist 6 is thinned by etching. The etching of the electrolytic plating film (5-2) formed in the low-density region thins the electrolytic plating film (5-2) formed on the copper foil 2 in the low-density region. As a result, the film thickness of the electrolytic plating film (5-2) formed on the copper foil 2 in the low-density region is substantially equal to the film thickness of the electrolytic plating film (5-1) formed on the copper foil 2 in the high-density region. Further, the etching of the electrolytic plating film (5-2) formed in the low-density region thins the electrolytic plating film (5-2) formed in the through holes (4-2) in the low-density region. As a result, the film thickness of the electrolytic plating film (5-2) formed in the through holes (4-2) in the low-density region is substantially equal to the film thickness of the electrolytic plating film (5-1) formed in the through holes (4-1) in the high-density region.

Figure 1G:
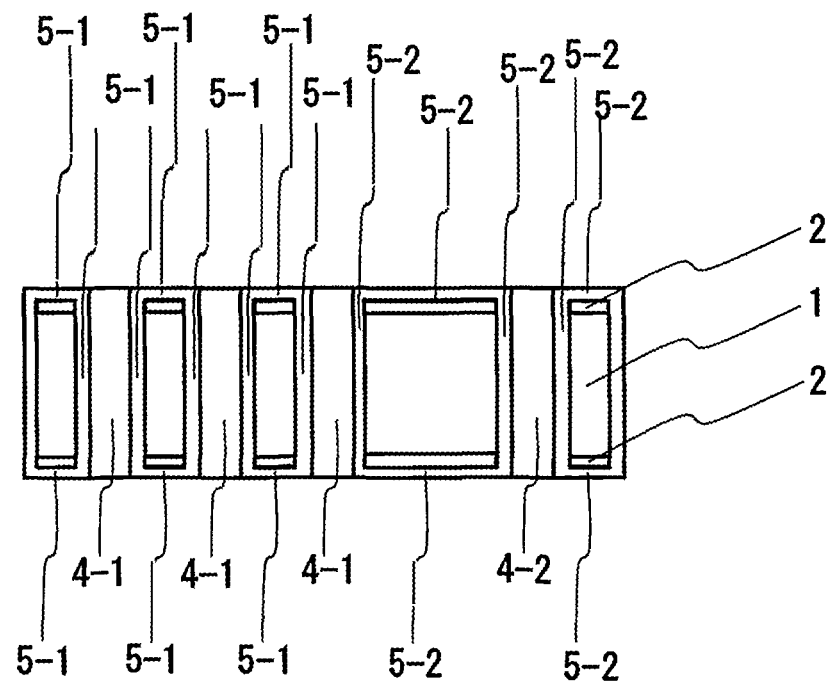
FIG. 1G is a diagram describing a process in a method for manufacturing a printed wiring board according to an embodiment of the present invention.

Next, as illustrated in FIG. 1G, after thinning the electrolytic plating film (5-2) formed in the low-density region, the masking resist 6 is peeled off from the electrolytic plating film (5-1) in the high-density region.

Figure 1H:
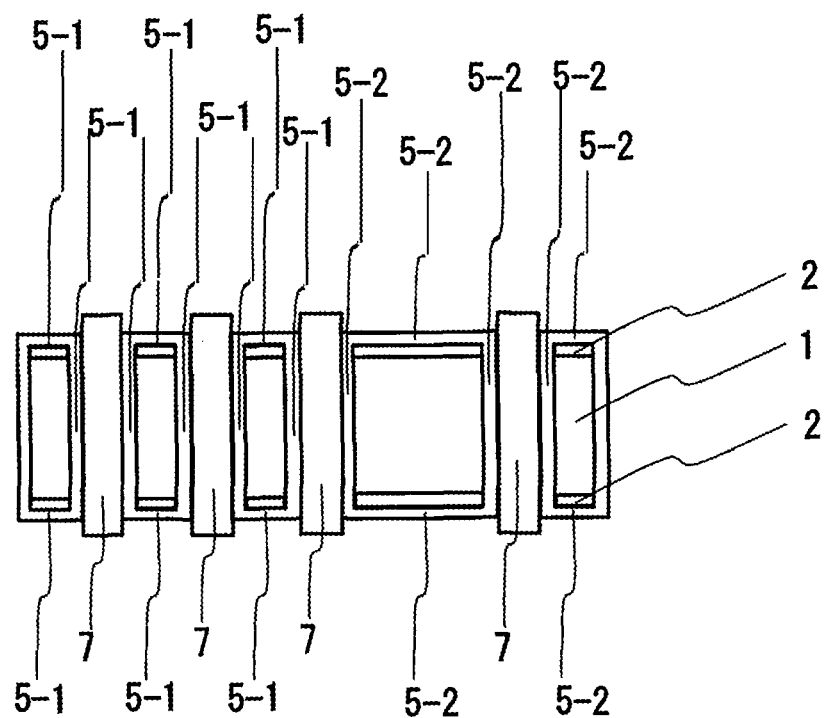
FIG. 1H is a diagram describing a process in a method for manufacturing a printed wiring board according to an embodiment of the present invention.
Figure 1I:
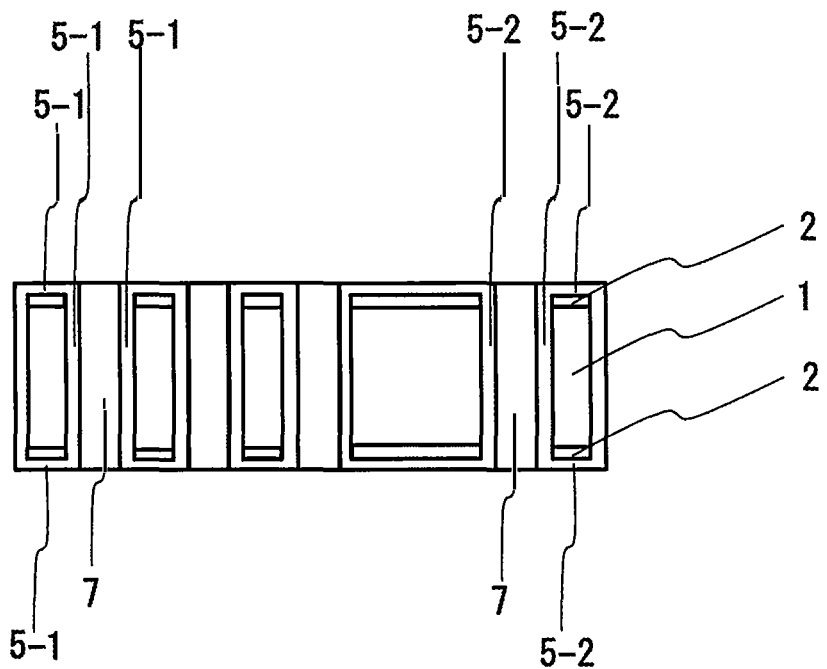
FIG. 1I is a diagram describing a process in a method for manufacturing a printed wiring board according to an embodiment of the present invention.
Figure 1J:
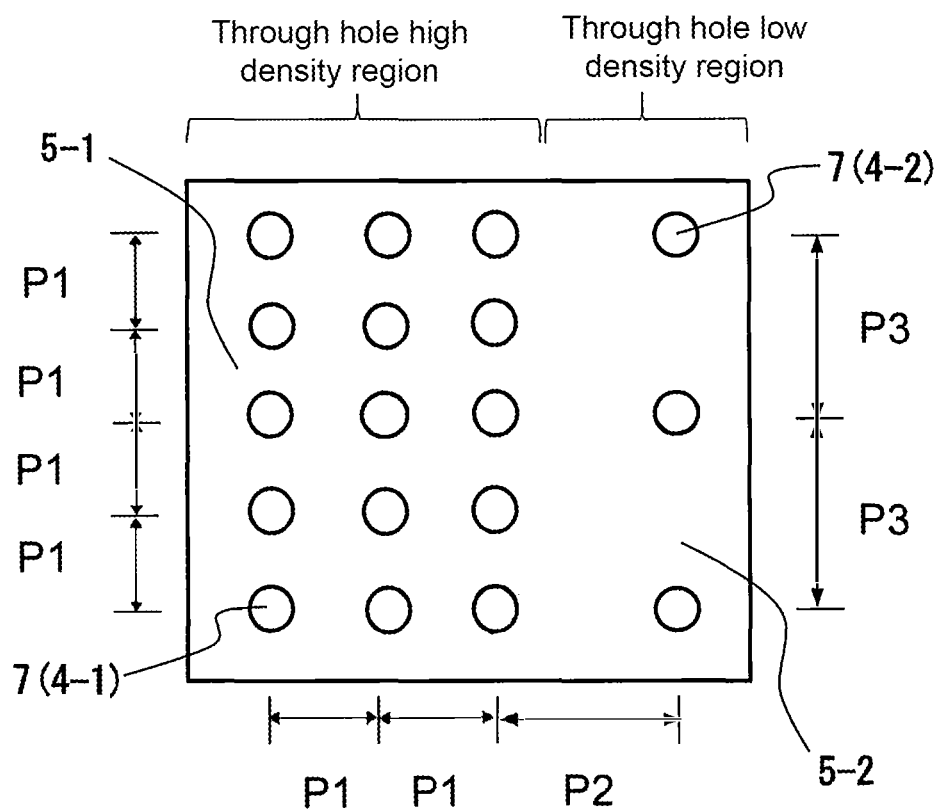
FIG. 1J is a diagram describing a process in a method for manufacturing a printed wiring board according to an embodiment of the present invention.
Figure 1K:
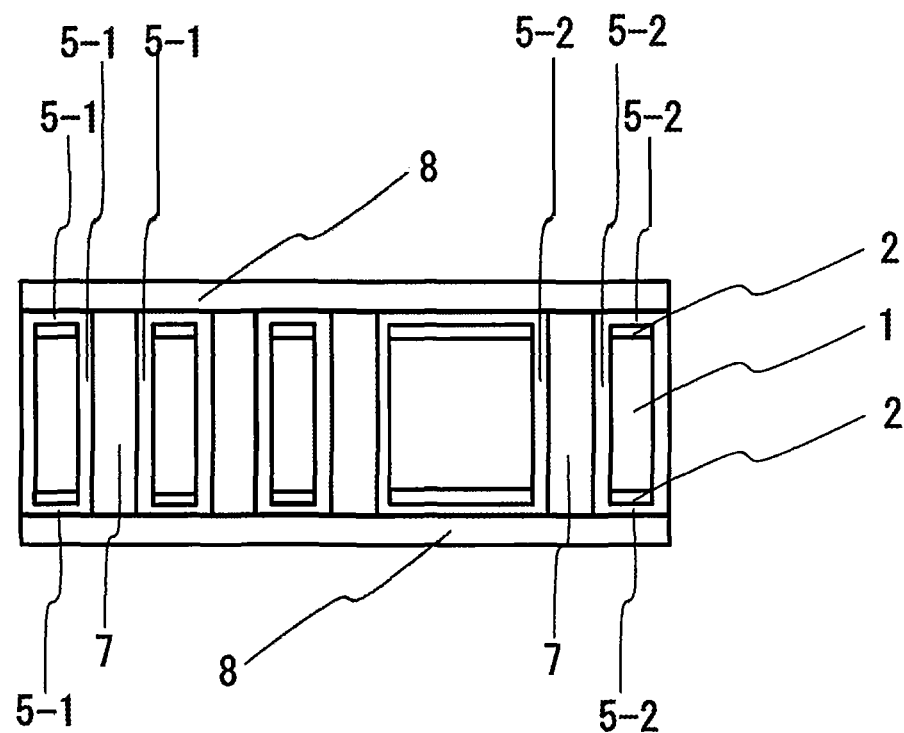
FIG. 1K is a diagram describing a process in a method for manufacturing a printed wiring board according to an embodiment of the present invention.
Figure 1L:
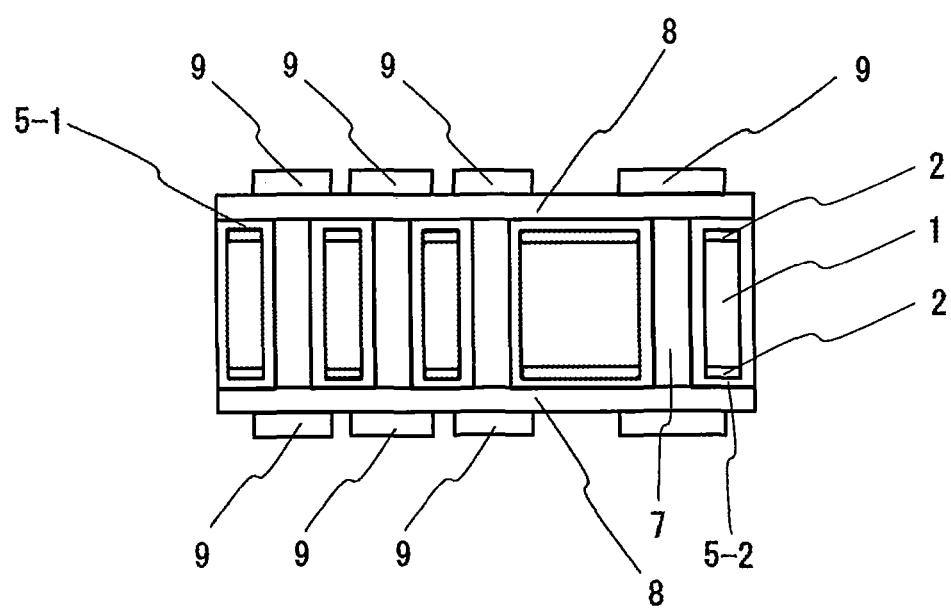
FIG. 1L is a diagram describing a process in a method for manufacturing a printed wiring board according to an embodiment of the present invention.

Next, as illustrated in FIG. 1H, cavities of the electrolytic plating film (5-1, 5-2) formed in the through holes (4-1, 4-2) in the high-density region and in the low-density region are filled with a filler 7. After that, as illustrated in FIGS. 1I and 1J, the surface of the electrolytic plating film (5-1, 5-2) on the copper foil 2 in the high-density region and in the low-density region is flattened by polishing. As a result, the film thickness of the electrolytic plating film (5-1) formed in the high-density region and the film thickness of the electrolytic plating film (5-2) formed in the low-density region are flattened. Further, the surface of the electrolytic plating film (5-1, 5-2) on the copper foil 2 in the high-density region and in the low-density region and the surface of the filler 7 protruding from the through holes (4-1, 4-2) are flattened. Then, as illustrated in FIG. 1K, a cover plating conductor 8 is formed so as to cover the through holes (4-1 and 4-2) filled with the filler 7 in the high-density region and in the low-density region.

Here, as the filler 7, for example, a thermosetting epoxy resin composition may be used. Further, for the filling of the through holes (4-1) and the through holes (4-2) with the filler 7, a printing method, a vacuum printing method, or the like may be used. Further, as a method for polishing the electrolytic plating film (5-1, 5-2) and the filler 7, methods such as buff polishing, belt polishing, and surface polishing may be used, and a polishing method may be properly selected according to product specifications.

As the filler 7, at least one selected from an epoxy resin, a magnetic material, and an inorganic filler may be used. By appropriately selecting the type of the filler 7, it is possible to adjust the rigidity of the printed wiring board, relax warpage of the board, suppress electrical signal noises, and adjust a dielectric constant. The magnetic material may be a ferromagnetic material, a diamagnetic material, or a paramagnetic magnetic material, and examples thereof include iron oxide, chromium oxide, cobalt, ferrite, and non-metal oxide magnetic materials. Examples of the inorganic filler include carbon black, ferrite, graphite, calcium carbonate, and the like. The cover plating conductor 8 is formed by electroless copper plating and subsequent electrolytic copper plating.

Next, as illustrated in FIG. 1L, an etching resist 9 is formed at positions where a conductor circuit 10 is formed on a surface of the cover plating conductor 8 formed in the high-density region and in the low-density region. For the forming of the etching resist 9, an alkali-resistant or acid-resistant printing method or vacuum printing method or the like may be used.

Figure 1M:
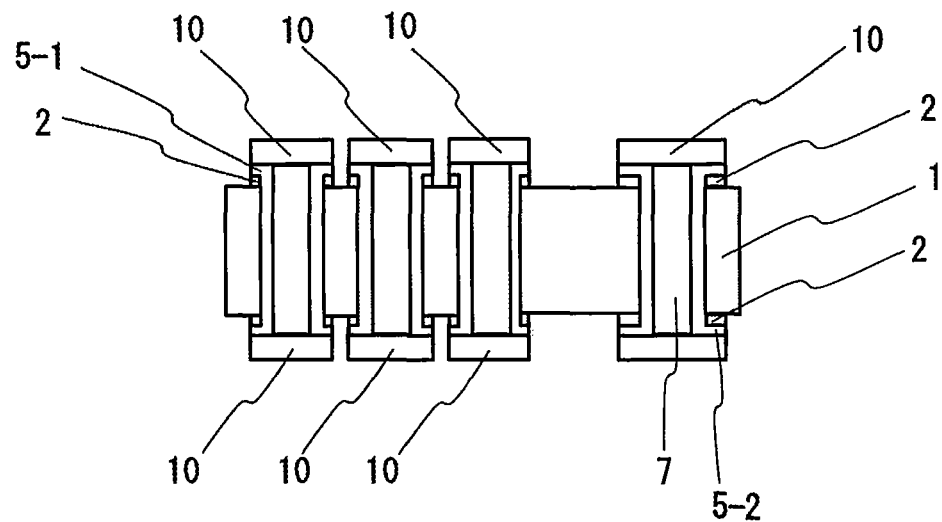
FIG. 1M is a diagram describing a process in a method for manufacturing a printed wiring board according to an embodiment of the present invention.

Next, as illustrated in FIG. 1M, the cover plating conductor 8, the electrolytic plating film (5-1, 5-2), and the copper foil 2 that are exposed from the etching resist 9 are removed by etching. After that, the etching resist 9 is removed to form the conductor circuit 10 including the copper foil 2 and the electrolytic plating film (5-1, 5-2) in the high-density region and in the low-density region. Both the etching, and the removal of the etching resist 9, may be conducted using known methods. After that, an interlayer insulating layer is formed on the formed conductor circuit 10 with patterns on both front and back sides, and, on the interlayer insulating layer, a predetermined number of conductor layers and interlayer insulating layers may be formed, and thereby, a build-up structure with a predetermined number of layers formed therein may be formed.

In the following, as a processing method used when forming the conductor circuit 10, a method for manufacturing a printed wiring board using a semi-additive method is described. In the following, with reference to FIGS. 2A-2D, a method for manufacturing a printed wiring board using a semi-additive method is described. In the example illustrated in FIGS. 2A-2D, the same members as those illustrated in FIGS. 1A-1I are indicated using the same reference numeral symbols, and description thereof is omitted.

Figure 2A:
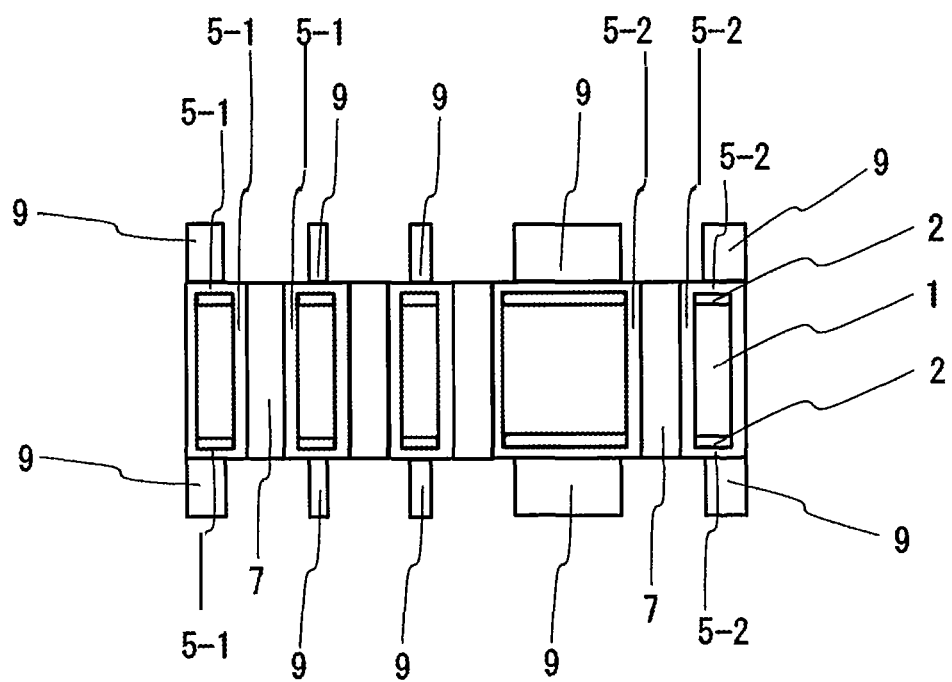
FIG. 2A is a diagram describing a process in a method for manufacturing a printed wiring board according to an embodiment of the present invention.
Figure 2B:
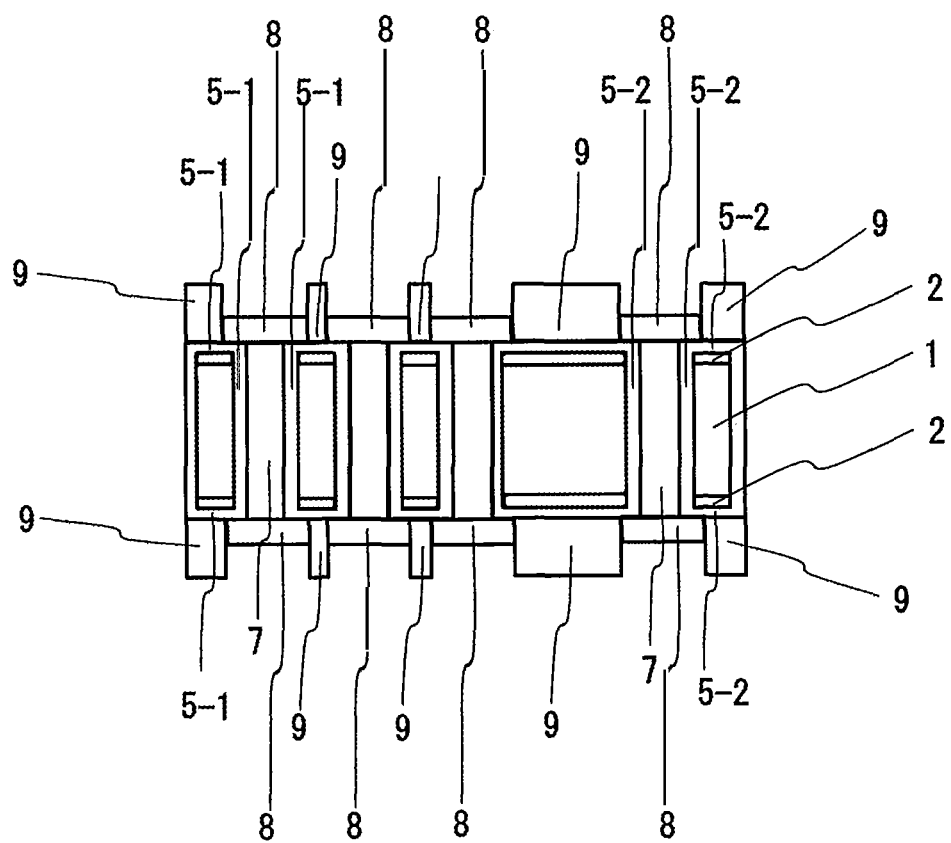
FIG. 2B is a diagram describing a process in a method for manufacturing a printed wiring board according to an embodiment of the present invention.
Figure 2C:
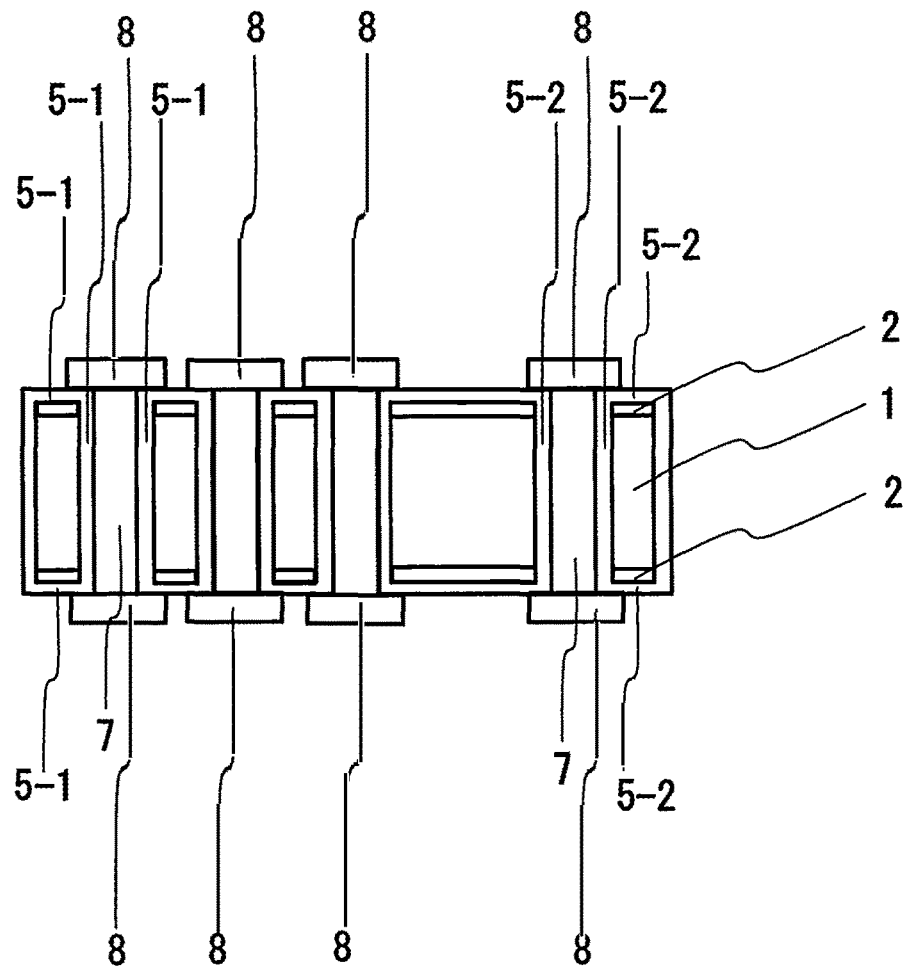
FIG. 2C is a diagram describing a process in a method for manufacturing a printed wiring board according to an embodiment of the present invention.
Figure 2D:
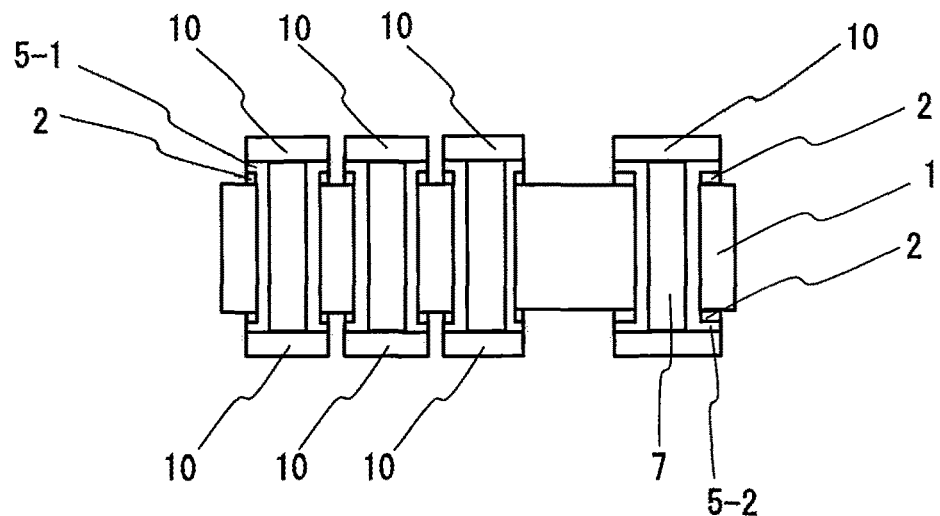
FIG. 2D is a diagram describing a process in a method for manufacturing a printed wiring board according to an embodiment of the present invention.

Each of FIGS. 2A-2D is a diagram illustrating a process of an embodiment in which the conductor circuit 10 is formed according to a semi-additive method. First, as illustrated in FIG. 2A, after the surface of the electrolytic plating film (5-1, 5-2) on the copper foil 2 in the high-density region and in the low-density region is flattened by polishing (corresponding to FIG. 1I), the etching resist 9 is formed at positions where the conductor circuit 10 is not formed. Next, as illustrated in FIG. 2B, the cover plating conductor 8 is formed on the surface of the filler 7 and on the surface of the electrolytic plating film (5-1 and 5-2) in regions where the etching resist 9 does not exist. Next, as illustrated in FIG. 2C, the etching resist 9 is removed. Finally, as illustrated in FIG. 2D, portions of the electrolytic plating film (5-1, 5-2) and the copper foil 2 in regions where the cover plating conductor 8 is not formed are removed by etching to form the conductor circuit 10 including the copper foil 2 and the electrolytic plating film (5-1, 5-2) in the high-density region and in the low-density region. Also in the present example, the formation of the etching resist 9, the etching, and the removal of the etching resist 9 may be conducted using known methods. A semi-additive method is more suitable for forming narrow-pitch conductor patterns than a subtractive method.

In the method for manufacturing a printed wiring board described above, adjacent through holes 4 may be formed at equal intervals, and the intervals (pitch) may be 300 μm or more. Making the intervals between adjacent multiple through holes equal intervals allows an overall density of the through holes to be uniform and a difference in film thickness between the electrolytic plating film formed in the high-density region and the electrolytic plating film formed in the low-density region to be reduced, and thus is preferable. Further, the film thickness of the electrolytic plating film 5 on inner walls of the multiple through holes 4 is preferably 10 μm or more and 30 μm or less. Further, a hole diameter of each of the multiple through holes 4 is preferably 100 μm or more and 300 μm or less. By setting the film thickness of the electrolytic plating film 5 on the inner walls of the multiple through holes 4 to 20 μm or more, it may be used as a conductor for power supply. Further, by setting the film thickness of the electrolytic plating film 5 to about 10 μm, it may be used as a conductor for signals.

According to the printed wiring board described above, by thinning the electrolytic plating film in the low-density region by etching, even when there is variation in the density of the through holes, it is possible to eliminate the difference in film thickness between the electrolytic plating film in the low-density region and the electrolytic plating film in the high-density region and manufacture a printed wiring board having a uniform plating thickness.

FIGS. 3(*a*)-3(*d*) are diagrams illustrating a conventional method for manufacturing a printed wiring board having multiple through holes. First, through holes 54 are formed by drilling in a double-sided copper-clad laminated plate 53 formed of an insulating substrate 51 and a copper foil 52 formed on surfaces on both sides of the insulating substrate 51, and an electrolytic plating film 55 is formed on the copper foil 52 and in the through holes 54 (FIG. 3(*a*)). Next, cavities of the electrolytic plating film 55 formed in the through holes 54 are filled with a filling resin 56, and the filling resin 56 protruding from the through holes 54 is removed by polishing (FIG. 3(*b*)). Next, a plating film 57 is formed so as to cover the through holes 54 filled with the filling resin 56 (FIG. 3(*c*)). Further, a conductor circuit 58 is formed by applying, for example, a subtractive method with respect to the plating film 57 (FIG. 3(*d*)).

In a printed wiring board manufactured using the method for manufacturing a printed wiring board described above, when there is variation in the density of the through holes, during formation of electrolytic plating, a film thickness of the electrolytic plating film 55 is small in a place where the density of the through holes is high, and the film thickness of the electrolytic plating film 55 is large in a place where the density of the through holes is low. Therefore, there is a problem that a difference occurs in the film thickness of the electrolytic plating film 55 on inner walls of the through holes 54 and on the copper foil 52. When the difference in the film thickness of the electrolytic plating film is large, it may be possible that process capability of wiring formation using a subtractive method may decrease, or wiring formation itself may become a barrier.

A method for manufacturing a printed wiring board according to an embodiment of the present invention has a uniform plating thickness by eliminating a difference in film thickness between an electrolytic plating film in a low-density region of through holes and an electrolytic plating film in a high-density region of through holes by thinning the electrolytic plating film in the low-density region by etching.

A method for manufacturing a printed wiring board according to an embodiment of the present invention includes: preparing a double-sided copper-clad laminated plate; forming multiple through holes in the double-sided copper-clad laminated plate such that a high-density region of the through holes and a low-density region of the through holes are formed; forming an electrolytic plating film on a copper foil of the double-sided copper-clad laminated plate in the high-density region, in the through holes in the high-density region, on a copper foil of the double-sided copper-clad laminated plate in the low-density region, and in the through holes in the low-density region; masking the electrolytic plating film in the high-density region with a masking resist; thinning the electrolytic plating film in the low-density region exposed from the masking resist by etching; peeling off the masking resist from the electrolytic plating film in the high-density region; and forming a conductor circuit including the copper foil and the electrolytic plating film in the high-density region and in the low-density region.

According to an embodiment of the present invention, it is possible to manufacture a printed wiring board having a uniform plating thickness by eliminating a difference in film thickness between the electrolytic plating film in the low-density region and the electrolytic plating film in the high-density region by thinning the electrolytic plating film in the low-density region by etching.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
    forming a plurality of through holes in a double-sided copper-clad laminated plate such that a high-density region of the through holes and a low-density region of the through holes are formed;
    forming an electrolytic plating film on a copper foil of the double-sided copper-clad laminated plate in the high-density and low-density regions of the through holes;
    forming a masking resist on the electrolytic plating film in the high-density region of the through holes such that the masking resist masks the electrolytic plating film in the high-density region of the through holes;
    etching the electrolytic plating film in the low-density region of the through holes exposed from the masking resist such that the electrolytic plating film in the low-density region of the through holes exposed from the masking resist is thinned;
    peeling off the masking resist from the electrolytic plating film in the high-density region of the through holes; and
    forming a conductor circuit comprising the copper foil and the electrolytic plating film in the high-density and low-density regions of the through holes,
    wherein the forming of the electrolytic plating film on the copper foil of the double-sided copper-clad laminated plate includes forming the electrolytic plating film in the through holes in the high-density and low-density regions.

2. The method for manufacturing a printed wiring board according to claim 1, wherein the etching includes etching the electrolytic plating film in the low-density region of the through holes exposed from the masking resist such that the electrolytic plating film in the through holes in the low-density region is thinned.

3. The method for manufacturing a printed wiring board according to claim 1, further comprising:
    filling a plurality of cavities of the electrolytic plating film formed in the through holes in the high-density and low-density regions with a filler.

4. The method for manufacturing a printed wiring board according to claim 3, further comprising:
    polishing a surface of the electrolytic plating film on the copper foil in the high-density and low-density regions of the through holes after the filling of the cavities with the filler such that the surface of the electrolytic plating film on the copper foil in the high-density and low-density regions of the through holes is flattened.

5. The method for manufacturing a printed wiring board according to claim 4, wherein the polishing includes flattening the surface of the electrolytic plating film on the copper foil in the high-density and low-density regions of the through holes and a surface of the filler protruding from the through holes.

6. The method for manufacturing a printed wiring board according to claim 3, further comprising:
    forming a cover plating conductor covering the through holes filled with the filler in the high-density and low-density regions.

7. The method for manufacturing a printed wiring board according to claim 3, wherein the filler is at least one filler selected from the group consisting of an epoxy resin, a magnetic material, and an inorganic filler.

8. The method for manufacturing a printed wiring board according to claim 1, wherein the conductor circuit in the high-density and low-density regions is formed by one of a subtractive method and a semi-additive method.

9. The method for manufacturing a printed wiring board according to claim 4, wherein the filler is at least one filler selected from the group consisting of an epoxy resin, a magnetic material, and an inorganic filler.

10. The method for manufacturing a printed wiring board according to claim 2, wherein the conductor circuit in the high-density and low-density regions is formed by one of a subtractive method and a semi-additive method.

11. The method for manufacturing a printed wiring board according to claim 5, wherein the filler is at least one filler selected from the group consisting of an epoxy resin, a magnetic material, and an inorganic filler.

12. The method for manufacturing a printed wiring board according to claim 3, wherein the conductor circuit in the high-density and low-density regions is formed by one of a subtractive method and a semi-additive method.

13. The method for manufacturing a printed wiring board according to claim 6, wherein the filler is at least one filler selected from the group consisting of an epoxy resin, a magnetic material, and an inorganic filler.

14. The method for manufacturing a printed wiring board according to claim 4, wherein the conductor circuit in the high-density and low-density regions is formed by one of a subtractive method and a semi-additive method.

15. The method for manufacturing a printed wiring board according to claim 5, wherein the conductor circuit in the high-density and low-density regions is formed by one of a subtractive method and a semi-additive method.

16. The method for manufacturing a printed wiring board according to claim 6, wherein the conductor circuit in the high-density and low-density regions is formed by one of a subtractive method and a semi-additive method.

17. The method for manufacturing a printed wiring board according to claim 7, wherein the conductor circuit in the high-density and low-density regions is formed by one of a subtractive method and a semi-additive method.

18. The method for manufacturing a printed wiring board according to claim 2, further comprising:

filling a filler in a plurality of cavities of the electrolytic plating film formed in the through holes in the high-density and low-density regions with a filler.

19. The method for manufacturing a printed wiring board according to claim 18, further comprising:

polishing a surface of the electrolytic plating film on the copper foil in the high-density and low-density regions of the through holes after the filling of the cavities with the filler such that the surface of the electrolytic plating film on the copper foil in the high-density and low-density regions of the through holes is flattened.

20. The method for manufacturing a printed wiring board according to claim 19, wherein the polishing includes flattening the surface of the electrolytic plating film on the copper foil in the high-density and low-density regions of the through holes and a surface of the filler protruding from the through holes.

* * * * *